(12) United States Patent
Lee

(10) Patent No.: US 10,373,689 B2
(45) Date of Patent: Aug. 6, 2019

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Dong Hun Lee, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/641,485

(22) Filed: Jul. 5, 2017

(65) Prior Publication Data
US 2018/0130535 A1    May 10, 2018

(30) Foreign Application Priority Data

Nov. 10, 2016 (KR) .......................... 10-2016-0149530

(51) Int. Cl.
*G11C 16/16* (2006.01)
*G11C 16/34* (2006.01)
*G11C 16/04* (2006.01)
*G11C 16/32* (2006.01)

(52) U.S. Cl.
CPC .......... *G11C 16/16* (2013.01); *G11C 16/3445* (2013.01); *G11C 16/0483* (2013.01); *G11C 16/32* (2013.01)

(58) Field of Classification Search
None
See application file for complete search history.

(56) References Cited

U.S. PATENT DOCUMENTS

| | | | | |
|---|---|---|---|---|
| 7,630,255 | B2* | 12/2009 | Yang | G11C 11/5635 365/185.11 |
| 8,976,597 | B2* | 3/2015 | Shiino | G11C 16/16 365/185.19 |
| 9,728,268 | B1* | 8/2017 | Takizawa | G11C 16/3445 |
| 2008/0158997 | A1* | 7/2008 | Hemink | G11C 11/5628 365/185.22 |
| 2012/0206972 | A1* | 8/2012 | Shiino | G11C 16/16 365/185.19 |

(Continued)

FOREIGN PATENT DOCUMENTS

| | | |
|---|---|---|
| KR | 1020120019689 A | 3/2012 |
| KR | 1020120092911 A | 8/2012 |
| KR | 1020130044698 A | 5/2013 |

*Primary Examiner* — Douglas King
(74) *Attorney, Agent, or Firm* — William Park & Associates Ltd.

(57) ABSTRACT

Provided herein are a semiconductor memory device and a method of operating the same. The semiconductor memory device in accordance with an embodiment may include a memory cell array, a peripheral circuit, and a control circuit. The memory cell array may include a plurality of memory blocks. The peripheral circuit may perform an erase operation on a selected memory block. The control circuit may control the peripheral circuit such that, during the erase operation, when the selected memory block has passed an erase verification, an additional erase verification operation is performed on memory cells coupled to a reference word line among a plurality of word lines coupled to the selected memory block, and the erase operation is performed according to a result of the additional erase verification operation for the memory cells coupled to the reference word line.

19 Claims, 9 Drawing Sheets

(56) References Cited

U.S. PATENT DOCUMENTS

| | | | |
|---|---|---|---|
| 2012/0206975 A1* | 8/2012 | Yang | G11C 11/5635 365/185.22 |
| 2013/0070527 A1* | 3/2013 | Sabbag | G11C 16/14 365/185.11 |
| 2016/0093387 A1* | 3/2016 | Oh | G11C 16/16 365/185.11 |

* cited by examiner

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0149530 filed on Nov. 10, 2016 in the Korean Intellectual Property Office, the entire disclosure of which is incorporated herein by reference.

BACKGROUND

1. Technical Field

Various embodiments of the present disclosure generally relate to an electronic device, and more particularly to a semiconductor memory device and a method of operating the semiconductor memory device.

2. Related Art

Semiconductor memory devices are memory devices realized using semiconductor materials such as silicon (Si), germanium (Ge), gallium arsenide (GaAs), indium phosphide (InP), or the like. Semiconductor memory devices may be classified into a volatile memory device and a nonvolatile memory device.

The volatile memory device is a memory device that only retains its data while it is powered. Representative examples of the volatile memory device include a static RAM (SRAM), a dynamic RAM (DRAM), a synchronous DRAM (SDRAM), etc. The nonvolatile memory device is a memory device that can retain its data even in the absence of a power source. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory may be classified into a NOR type memory and a NAND type memory.

SUMMARY

In an embodiment of the present disclosure, a semiconductor memory device may include a memory cell array, a peripheral circuit, and a control circuit. The memory cell array may include a plurality of memory blocks. The peripheral circuit may perform an erase operation for a selected memory block. The control circuit may control the peripheral circuit such that, during the erase operation, when the selected memory block has passed an erase verification, an additional erase verification operation is performed on memory cells coupled to a reference word line among a plurality of word lines coupled to the selected memory block, and the erase operation is performed according to a result of the additional erase verification operation for the memory cells coupled to the reference word line.

In an embodiment of the present disclosure, a method of operating a semiconductor memory device may include performing an erase operation for a selected memory block among a plurality of memory blocks. The method may include, when the selected memory block has passed an erase verification, performing an additional erase verification operation on memory cells coupled to a reference word line among a plurality of word lines coupled to the selected memory block. The method may include performing the erase operation according to a result of the additional erase verification operation for the memory cells coupled to the reference word line.

In an embodiment of the present disclosure, a method of operating a semiconductor memory device may include applying an erase voltage to a selected memory block. The method may include performing a first verify operation using a first verify voltage to check whether an erase operation of the selected memory block has been completed. The method may include performing, when the selected memory block has failed an erase verification, a second verify operation using a second verify voltage having a level higher than a level of the first verify voltage to check whether the erase operation of the selected memory block has been completed. The method may include performing, when the selected memory block has passed the erase verification, an additional erase verification operation with respect to memory cells coupled to a reference word line among memory cells included in the selected memory block.

DETAILED DESCRIPTION

Figure 1:
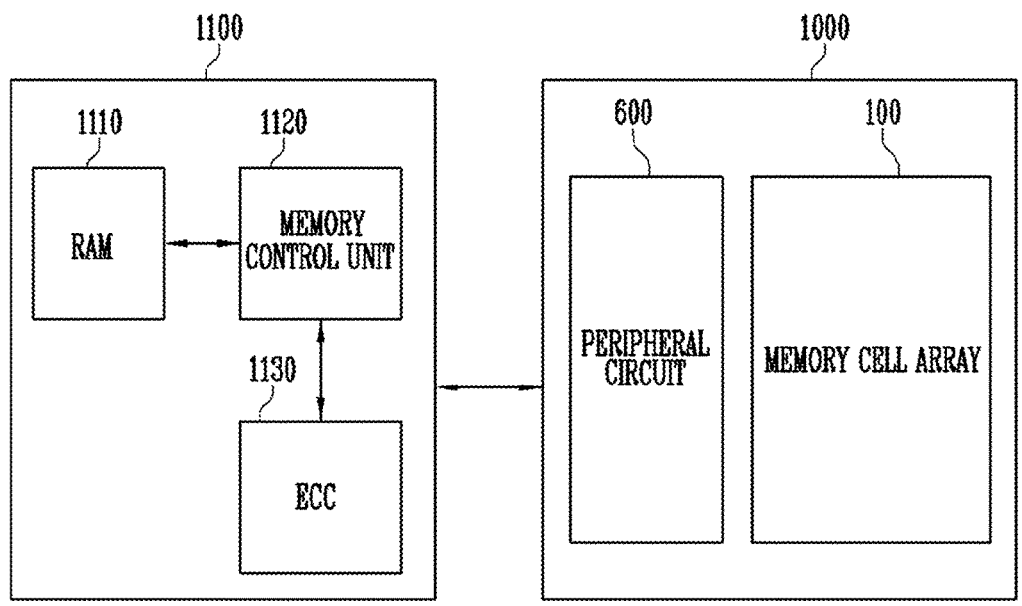
FIG. 1 is a diagram illustrating an example of the configuration of a memory system.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, the present disclosure will be described in detail by describing exemplary embodiments of the present disclosure with reference to the attached drawings. Below, embodiments of the present disclosure will be described in detail with reference to the attached drawings.

FIG. 1 is a diagram illustrating an example of the configuration of a memory system.

The memory system 50 includes a semiconductor memory device 1000 and a controller 1100.

Examples of the semiconductor memory device 1000 may include a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), and a spin transfer torque random access memory (STT-RAM). In addition, the semiconductor memory device 1000 according to an embodiment of the present disclosure may have a three-dimensional array structure. Various embodiments of the present disclosure may be applied not only to a flash memory in which a charge storage layer is formed of a conductive floating gate (FG), but also to a charge trap flash (CTF) memory in which a charge storage layer is formed of an insulating layer.

The semiconductor memory device 1000 includes a memory cell array 100 and a peripheral circuit 600 for driving the memory cell array 100. The memory cell array 100 may include a plurality of nonvolatile memory cells.

The memory cell array 100 includes a plurality of memory cells. The plurality of memory cells may be grouped into a plurality of memory block. The memory cells included in each memory block may be defined as a plurality of pages. A single page may be defined as a plurality of memory cells coupled to the same word line.

The peripheral circuit 600 is operated under the control of the controller 1100. The peripheral circuit 600 may write data into the memory cell array 100 during a program operation under the control of the controller 1100. The peripheral circuit 600 may read data from the memory cell array 100 or erase data from the memory cell array 100.

In various embodiments, the read or program operation of the semiconductor memory device 1000 may be performed on a page basis. The erase operation of the semiconductor memory device 1000 may be performed on a memory block basis.

During the program operation, the peripheral circuit 600 may receive, from the controller 1100, a program command, a physical block address (PBA), and data to be written. When a single page in a single memory block is selected based on the PBA, the peripheral circuit 600 may write data into the selected page.

During a read operation, the peripheral circuit 600 may receive a read command and a PBA from the controller 1100. The peripheral circuit 600 may read data from a single page of a single memory block that is selected by the PBA, and may output the read data (hereinafter, referred to as "page data") to the controller 1100.

During an erase operation, the peripheral circuit 600 may receive an erase command and a PBA from the controller 1100. The PBA may specify one memory block. The peripheral circuit 600 may erase data from the memory block corresponding to the PBA.

The controller 1100 controls the overall operation of the semiconductor memory device 1000. The controller 1100 may access the semiconductor memory device 1000 in response to a request from an external device such as a host (hereinafter "host"). The controller 1100 may command the semiconductor memory device 1000 in response to a request from the host.

In an embodiment, the controller 1100 may control the semiconductor memory device 1000 so that a program operation, a read operation or an erase operation is performed. During a program operation, the controller 1100 may provide a program command, an address, and data to the semiconductor memory device 1000 through a channel. During a read operation, the controller 1100 may provide a read command and an address to the semiconductor memory device 1000 through the channel. During an erase operation, the controller 1100 may provide an erase command and an address to the semiconductor memory device 1000 through the channel.

The controller 1100 may include a random access memory (RAM) 1110, a memory control unit 1120, and an error correction circuit 1130.

The RAM 1110 may be operated under the control of the memory control unit 1120, and may be used as a work memory, a buffer memory, a cache memory, etc. In the case where the RAM 1110 is used as the work memory, data that is processed by the memory control unit 1120 may be temporarily stored in the RAM 1110. In the case where the RAM 1110 is used as the buffer memory, it may be used to temporarily hold data to be transmitted from the external device such as a host (not illustrated) to the semiconductor memory device 1000 or from the semiconductor memory device 1000 to the host.

The memory control unit 1120 may control read, program, erase, and background operations of the semiconductor memory device 1000. The memory control unit 1120 may control the semiconductor memory device 1000 by running firmware.

The memory control unit 1120 may perform the function of a flash translation layer (FTL). The memory control unit 1120 may translate a logical block address (LBA), provided by the host, into a physical block address (PBA) through the FTL. The FTL may receive the LBA and translate the LBA into the PBA using a mapping table. Here, examples of address mapping methods performed through the FTL may include a page mapping method, a block mapping method, and a hybrid mapping method.

The error correction code circuit 1130 may generate an error correction code (ECC) and add it to data to be written. Furthermore, during a read operation, the error correction code circuit 1130 may correct an erroneous bit in data using the ECC. The error correction code circuit 230 may correct the erroneous bits in the data using a low density parity check (LDPC) code, a Bose, Chaudhri, Hocquenghem (BCH) Code, a turbo code, a Reed-Solomon code, a convolution code, a recursive systematic code (RSC), coded modulation such as trellis-coded modulation (TCM), block coded modulation (BCM), or hamming code.

During a read operation, the error correction code circuit 1130 may correct an error contained in page data. When a number of erroneous bits in page data exceeds a number of correctable bits, decoding may fail. When the number of erroneous bits in the page data falls within the number of correctable bits, decoding may succeed.

A success in decoding indicates that the corresponding read command has passed. A failure in decoding indicates that the corresponding read command has failed. When decoding succeeds, the controller 1100 outputs error-corrected page data to the host.

Although not illustrated, the controller 1100 may further include a memory interface for communicating with the semiconductor memory device 1000. The memory interface includes a protocol for communicating with the semiconductor memory device 1000. For example, the memory interface may include at least one of flash interfaces such as a NAND interface, a NOR interface, etc.

Furthermore, the controller 1100 may include a host interface (not illustrated) for performing data exchange between the host and the controller 1100. The host interface may include a protocol for performing communication between the host and the controller 1100. In an embodiment, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Figure 2:
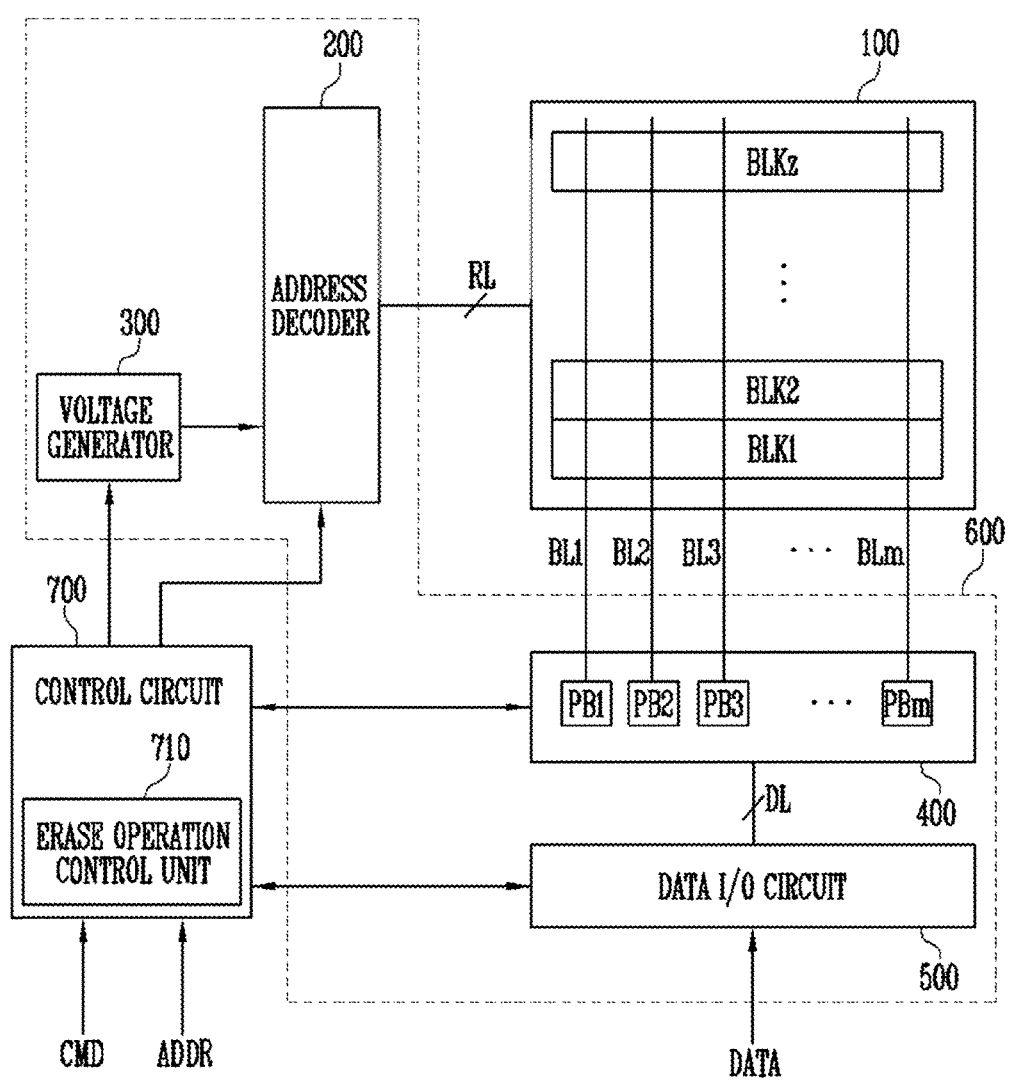
FIG. 2 is a diagram illustrating an example of a semiconductor memory device in accordance with to an embodiment of the present disclosure.

FIG. 2 is a diagram illustrating an example of a semiconductor memory device in accordance with to an embodiment of the present disclosure.

Figure 3:
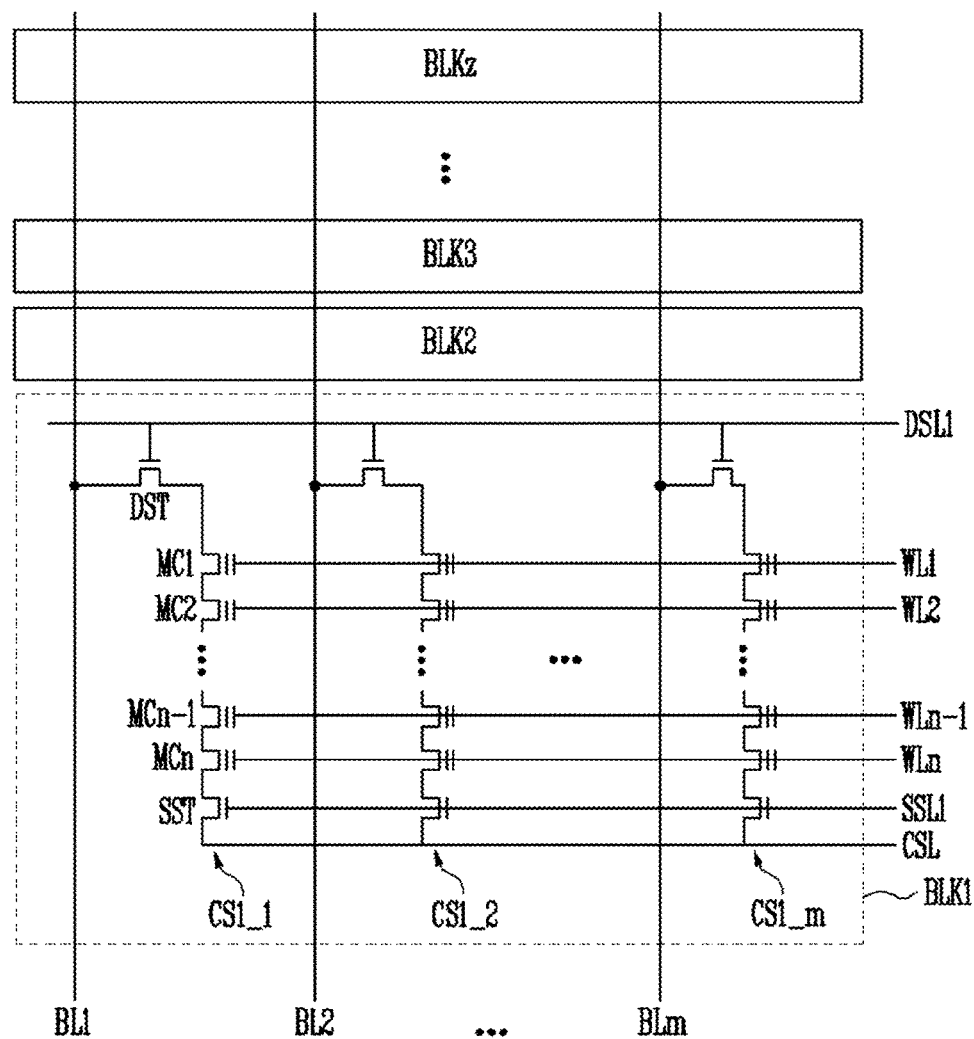
FIG. 3 is a diagram illustrating an example of the structure of a memory cell array of FIG. 2.

FIG. 3 is a diagram illustrating an example of the structure of a memory cell array 100 of FIG. 2.

Referring to FIG. 2, the semiconductor memory device 1000 includes the memory cell array 100, a peripheral circuit 600, and a control circuit 700.

The memory cell array 100 includes a plurality of memory blocks BLK1 to BLKz. The plurality of memory blocks BLK1 to BLKz may be coupled to an address decoder 200 through row lines RL. The memory blocks BLK1 to BLKz may be coupled to a read/write circuit 400 through bit lines BL1 to BLm. Each of the memory blocks BLK1 to BLKz includes a plurality of memory cells. In an embodiment, the plurality of memory cells may be nonvolatile memory cells. Memory cells coupled to the same word line are defined as one page, and the memory cell array 100 includes a plurality of pages.

Each of the memory cells of the semiconductor memory device 1000 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

Referring to FIG. 3, first to z-th memory blocks BLK1 to BLKz included in a memory cell array 100_1 are coupled in common to first to m-th bit lines BL1 to BLm. In FIG. 3, for the sake of explanation, elements of only the first memory block BLK1 among the plurality of memory blocks BLK1 to BLKz are illustrated, and illustration of elements of each of the other memory blocks BLK2 to BLKz is omitted. It will be understood that each of the memory blocks BLK2 to BLKz has the same configuration as that of the first memory block BLK1.

The memory block BLK1 includes a plurality of cell strings CS1_1 to CS1_m. The first to m-th cell strings CS1_1 to CS1_m are, respectively, coupled to the first to m-th bit lines BL1 to BLm.

Each of the first to m-th cell strings CS1_1 to CS1_m includes a drain select transistor DST, a plurality of memory cells MC1 to MCn, which are coupled in series to each other, and a source select transistor SST. The drain select transistor DST is coupled to a drain select line DSL1. The first to n-th memory cells MC1 to MCn are, respectively, coupled to first to n-th word lines WL1 to WLn. The source select transistor SST is coupled to a source select line SSL1. A drain of the drain select transistor DST is coupled to the corresponding bit line. The drain select transistors DST of the first to m-th cell strings CS1_1 to CS1_m are respectively coupled to the first to m-th bit lines BL1 to BLm. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 200. The common source line CSL is controlled by the control circuit 700. The first to m-th bit lines BL1 to BLm are controlled by the read/write circuit 400.

Referring again to FIG. 2, the peripheral circuit 600 may include the address decoder 200, a voltage generator 300, the read/write circuit 400, and a data input/output circuit 500.

The peripheral circuit 600 may be used to perform various operations on the memory cell array 100 under the control of the control circuit 700. For example, the peripheral circuit 600 may be used to perform a program operation, a read operation, and an erase operation on the memory cell array 100 under the control of the control circuit 700.

The address decoder 200 may be coupled to the memory cell array 100 through the row lines RL. The address decoder 200 may operate in response to control signals provided by the control circuit 700. The address decoder 200 receives addresses ADDR from the control circuit 700 through an input/output buffer (not illustrated) included in the semiconductor memory device 1000.

The address decoder 200 may decode the addresses ADDR to obtain a block address. The address decoder 200 may selects one or more of the memory blocks BLK1 to BLKz in response to the block address. The address decoder 200 may decode the addresses ADDR to obtain a row address. In response to the decoded row address, the address decoder 200 may select at least one word line of the selected memory block by applying voltages supplied from the voltage generator 300 to at least one word line WL.

During a program operation, the address decoder 200 may apply a program voltage to the selected word line and apply a pass voltage having a level lower than that of the program voltage to unselected word lines. During a program verify operation, the address decoder 200 may apply a verify voltage to a selected word line and apply a verification pass voltage higher than the verify voltage to unselected word lines.

During a read operation, the address decoder 200 may apply a read voltage to a selected word line and apply a pass voltage higher than the read voltage to unselected word lines.

In an embodiment, an erase operation of the semiconductor memory device 1000 is performed on a memory block basis. The address ADDR provided to the semiconductor memory device 1000 during an erase operation includes a block address. The address decoder 200 may decode the address ADDR to obtain the block address and select a corresponding memory block based on the block address.

During an erase operation, the address decoder 200 may apply a ground voltage to word lines coupled to the selected memory block.

In an embodiment, the address decoder 200 may include a block decoder, a word line decoder, an address buffer, etc.

The voltage generator 300 may generate a plurality of voltages using an external supply voltage provided to the semiconductor memory device 1000. The voltage generator 300 is operated under the control of the control circuit 700.

In an embodiment, the voltage generator 300 may generate an internal supply voltage by regulating an external supply voltage. The internal supply voltage generated by the voltage generator 300 is used as an operating voltage for the semiconductor memory device 1000.

In an embodiment, the voltage generator 300 may produce a plurality of voltages using the external supply voltage or the internal supply voltage. For example, the voltage generator 300 may include a plurality of pumping capacitors that receive the internal supply voltage and generate a plurality of voltages by selectively activating the plurality of pumping capacitors under the control of the control logic 700. The generated voltages are applied to selected word lines by the address decoder 200.

The read/write circuit 400 may include first to m-th page buffers PB1 to PBm. The first to m-th page buffers PB1 to PBm are coupled to the memory cell array 100 through the first to m-th bit lines BL1 to BLm, respectively. The first to m-th page buffers PB1 to PBm are operated under the control of the control circuit 700.

The first to m-th page buffers PB1 to PBm may be used to transfer data from the data input/output circuit 500 to the memory cell array 100 or from the memory cell array 100 to the data input/output circuit 500.

During a program operation, the first to m-th page buffers PB1 to PBm receive data DATA to be stored in the memory cell array 100 from the data input/output circuit 500 over data lines DL. The first to m-th page buffers PB1 to PBm may transmit the data DATA to selected memory cells through the bit lines BL1 to BLm when a program pulse is applied to each selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be maintained. During a program verify operation, the first to m-th page buffers PB1 to PBm read page data from selected memory cells through the bit lines BL1 to BLm.

During a read operation, the read/write circuit 400 reads data DATA from the memory cells in the selected page through the bit lines BL, and the data DATA may be transmitted to the data input/output circuit 500 over the data lines DL.

During an erase operation, the read/write circuit 400 may allow the bit lines BL to float. In an embodiment, the read/write circuit 400 may include a row select circuit.

The data input/output circuit 500 is coupled to the first to m-th page buffers PB1 to PBm through the data lines DL. The data input/output circuit 500 is operated under the control of the control circuit 700. During a program operation, the data input/output circuit 500 receives data DATA to be stored in the memory cell array 100 from an external controller (not illustrated). During a read operation, the data input/output circuit 500 outputs, to the external controller, the data received from the first to m-th page buffers PB1 to PBm included in the read/write circuit 400.

The control circuit 700 is coupled to the address decoder 200, the voltage generator 300, the read/write circuit 400, and the data input/output circuit 500. The control circuit 700 may control the overall operation of the semiconductor memory device 1000. The control circuit 700 receives a command CMD and addresses ADDR from the external controller. The control circuit 700 may control the peripheral circuit 600 in response to the command CMD. In order to execute the command CMD, the control circuit 700 may control the address decoder 200, the voltage generator 300, the read/write circuit 400, and the data input/output circuit 500. In an embodiment, during an erase operation, the control circuit 700 may apply a high erase voltage to the source line.

The control circuit 700 may further include an erase operation control unit 710.

The erase operation control unit 710 may control, during an erase operation, at least one of an erase voltage to be applied to the memory block, a time for which the erase voltage is applied, and an erase verify voltage.

In detail, the erase operation control unit 710 may set a voltage level of the erase voltage and a period of time for which the erase voltage is applied, and may control the peripheral circuit 600 such that the erase voltage is applied to the selected memory block for the set period of time.

The erase operation of the semiconductor memory device 1000 may be performed by repeating an erase loop including an erase voltage application operation and an erase verify operation. The erase voltage application operation may include applying an erase voltage to the selected memory block and thus reducing threshold voltages of the memory cells included in the selected memory block. The erase verify operation may include determining whether the memory cells of the selected memory block have been erased.

In an embodiment, the semiconductor memory device 1000 may perform the erase operation using an incremental step pulse erase (ISPE) method. The ISPE method consists of a series of erase and verify iterations. After each application of the erase voltage, the erase verify operation is performed to ensure a target threshold voltage level is reached, and if not, the erase voltage application operation and the erase verify operation are repeated. As the iteration count increases, the erase voltage also increases by a step voltage.

According to an embodiment of the present disclosure, the erase operation control unit 710 may control the peripheral circuit 600 such that, if the result of the erase verification for the selected memory block indicates "pass," an additional erase verification operation is performed to check erase states of memory cells coupled to a preset reference word line among the memory cells included in the selected memory block. In an embodiment, the erase operation control unit 710 may verify the erase states of the memory cells coupled to the reference word line, by performing a read operation for the reference word line.

In an embodiment, the erase operation control unit 710 may determine whether to terminate the erase operation depending on the result of the erase verification for the memory cells coupled to the reference word line. For instance, the erase operation control unit 710 may control the peripheral circuit 600 such that, even if the result of the verification for the selected memory block indicates "pass," if the result of the erase verification for the memory cells coupled to the reference word line indicates "fail," the erase operation is not terminated, and the erase loop is repeatedly performed until the memory cells coupled to the reference word line have passed the erase verification.

In an embodiment, the erase operation control unit 710 may set the level of the erase voltage and the period of time for which the erase voltage is applied (hereinafter referred to as "duration of the erase voltage application") depending on the result of the erase verification for the memory cells coupled to the reference word line. For example, if the result of erase verification for the memory cells coupled to the reference word line indicates "fail," the erase operation control unit 710 may set the step voltage to a value less than a preset step voltage, or may reduce the duration of the erase voltage application (application time) so that it is shorter than a preset duration of the erase voltage application (preset application time). Alternatively, if the result of erase verification for the memory cells coupled to the reference word line indicates "fail," the erase operation control unit 710 may set the step voltage to a value less than the level of the preset step voltage, and may also reduce the duration of the erase voltage application (application time) so that it is shorter than the present duration of the erase voltage application (application time).

In various embodiments, if the result of the erase verification for the selected memory block indicates "fail," the erase operation control unit 710 may change the erase verify voltage and perform erase verification for the selected memory block. For example, a first verify operation using a first verify voltage is performed, and if the selected memory block has failed to pass a first verification, the erase operation control unit 710 may use a second verify voltage higher than the first verify voltage as the erase verify voltage and perform a second verify operation for the selected memory block. Depending on the result of the second verify operation, the erase operation control unit 710 may set the erase voltage and the duration of the erase voltage application (application time). In detail, if the result of the second verify operation indicates "fail," the erase operation control unit 710 repeats the erase loop based on the preset step voltage and the preset duration of the erase voltage application (application time). If the result of the second verify operation indicates "pass," the step voltage may be set to a value less than the preset step voltage, or the duration of the erase voltage application (application time) may be reduced to be shorter than the preset duration of the erase voltage application (preset application time). Alternatively, the erase operation control unit 710 may set the step voltage to a value less than the preset step voltage, and may also set the duration of the erase voltage application so that it is shorter than the present duration of the erase voltage application (preset application time).

The erase operation control unit 710 may control the peripheral circuit 600 such that, if the result of the first verify operation indicates "pass," an additional erase verification operation is performed to check erase states of memory cells coupled to the preset reference word line among the memory cells included in the selected memory block. In an embodiment, the erase operation control unit 710 may verify the erase states of the memory cells coupled to the reference word line, by performing a read operation for the reference word line.

In an embodiment, the erase operation control unit 710 may determine whether to terminate the erase operation depending on the result of the erase verification for the memory cells coupled to the reference word line. For instance, the erase operation control unit 710 may control the peripheral circuit 600 such that, even if the result of the verification for the selected memory block indicates "pass," if the result of the erase verification for the memory cells coupled to the reference word line indicates "fail," the erase operation is not terminated, and the erase loop is repeatedly performed until the memory cells coupled to the reference word line have passed the erase verification.

In an embodiment, the erase operation control unit 710 may set the level of the erase voltage and the duration of the erase voltage application depending on the result of the erase verification for the memory cells coupled to the reference word line. For example, if the result of the erase verification for the memory cells coupled to the reference word line indicates "fail," the erase operation control unit 710 may set the step voltage to a value less than the preset step voltage, or may reduce the duration of the erase voltage application so that it is shorter than the preset duration of the erase voltage application. Alternatively, if the result of erase verification for the memory cells coupled to the reference word line indicates "fail," the erase operation control unit 710 may set the step voltage to a value less than the level of the preset step voltage, and may also set the duration of the erase voltage application to a duration that is shorter than the present duration of the erase voltage application.

Figure 4:
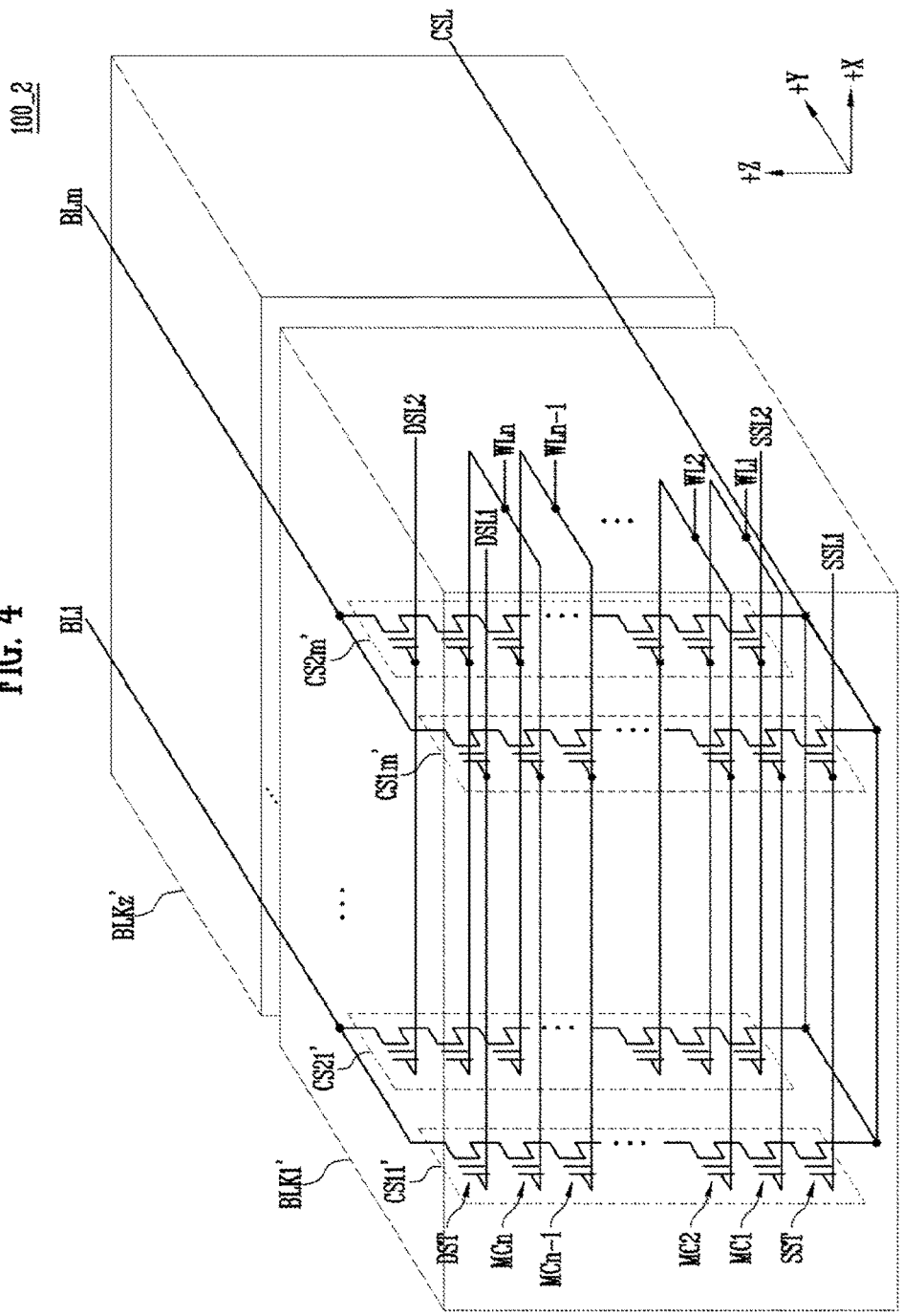
FIG. 4 illustrates an example of the memory cell array of FIG. 2 in accordance with an embodiment of the present disclosure.

FIG. 4 illustrates an example of the memory cell array of FIG. 2 in accordance with an embodiment of the present disclosure.

Referring to FIG. 4, a memory cell array 100_2 includes a plurality of memory blocks BLK1' to BLKz'. In FIG. 4, an internal configuration of the first memory block BLK1' is illustrated, and internal configurations of the other memory blocks BLK2' to BLKz' are omitted for the convenience of illustration. It will be understood that each of the second to z-th memory blocks BLK2' to BLKz' may have the same configuration as that of the first memory block BLK1'.

The first memory block BLK1' includes a plurality of cell strings CS11' to CS1$m$' and CS21' to CS2$m$'. Each of the plurality of cell strings CS11' to CS1$m$' and CS21' to CS2$m$' extends in a positive (+) Z direction. In the first memory block BLK1, m cell strings are arranged in a +X direction. Although FIG. 4 illustrates only two cell strings arranged in a +Y direction, it will be understood that three or more cell strings may be arranged in the column direction.

Each of the cell strings CS11' to CS1$m$' and CS21' to CS2$m$' includes at least one source select transistor SST, first to n-th memory cells MC1 to MCn, and at least one drain select transistor DST.

The source select transistor SST of each cell string is coupled between the common source line CSL and the memory cells MC1 to MCn. The source select transistors of cell strings arranged in the same row are coupled to the same source select line. Source select transistors of cell strings CS11' to CS1$m$' arranged in a first row are coupled to a first source select line SSL1. Source select transistors of cell strings CS21' to CS2$m$' arranged in a second row are coupled to a second source select line 55L2. In an embodiment, source select transistors of the cell strings CS11' to CS1$m$' and CS21' to CS2$m$' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

In an embodiment, at least one of the first to n-th memory cells MC1 to MCn may be used as a dummy memory cell. When the dummy memory cell is provided, the voltage or current of the corresponding cell string may be stably controlled. Thereby, the reliability of data stored in the memory block BLK1 is improved.

The drain select transistor DST of each cell string is coupled between the corresponding bit line and the memory cells MC1 to MCn. Drain select transistors of cell strings arranged in the row direction are coupled to drain select lines extending in the row direction. Drain select transistors of cell strings CS11' to CS1$m$' in the first row are coupled to a first drain select line DSL1. Drain select transistors of cell strings CS21' to CS2$m$' in the second row are coupled to a second drain select line DSL2.

In an embodiment, each of the plurality of cell strings may include at least one source select transistor, first to m-th memory cells, a pipe transistor, and at least one drain select transistor. In this case, each of the cell strings may have a 'U' shape. That is, the first to m-th memory cells may be divided into the first to p-th memory cells and the p+1-th to m-th memory cells. The first to p-th memory cells may be successively arranged in a direction opposite to the +Z direction, and may be coupled in series between the source select transistor and the pipe transistor. The p+1-th to m-th memory cells MCp+1 to MCn may be successively arranged in the +Z direction, and may be coupled in series between the pipe transistor and the drain select transistor. The first to p-th memory cells and the p+1-th to m-th memory cells may be coupled through the pipe transistor. In an embodiment, a gate of the pipe transistor of each cell string may be coupled to a pipeline.

The semiconductor memory device in accordance with an embodiment of the present disclosure may include memory blocks each of which includes memory cell strings illustrated in FIG. 4, or may include memory blocks each of which includes 'U'-shaped memory cell strings having a pipe transistor. The shape of the memory cell string and whether the pipe transistor is present are not limited to the examples discussed above.

Figure 5:
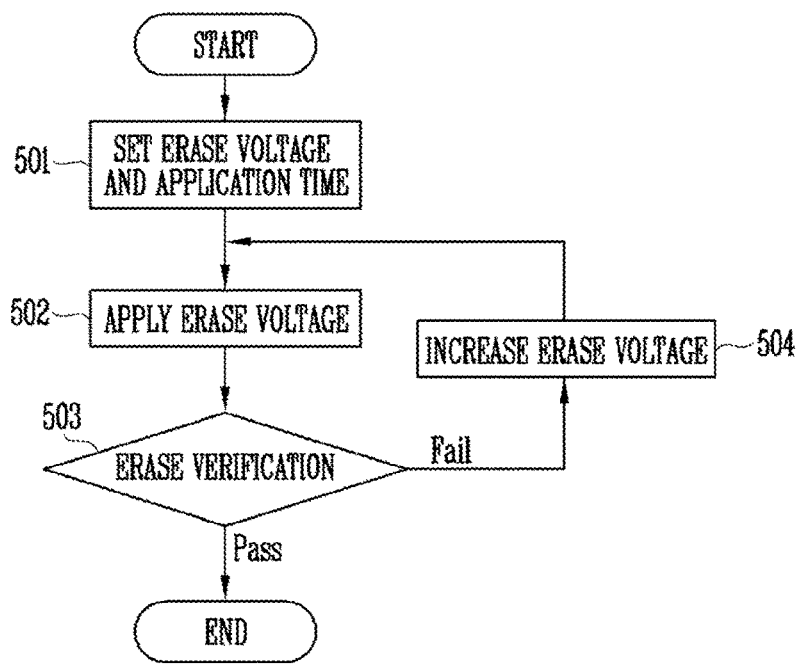
FIG. 5 is a flowchart illustrating an example of an erase operation of a semiconductor memory device.

FIG. 5 is a flowchart illustrating an example of an erase operation of a semiconductor memory device.

The semiconductor memory device generates an erase voltage during an erase operation and applies the generated erase voltage to a common source line CSL (Source Bias). In this case, the source select transistor SST and the drain select transistor DST are floating. An erase enable voltage (e.g., a ground voltage) may be applied to local word lines of a selected memory block.

After data contents of the memory cells have been erased by the erase operation, the erase voltage, which has been being applied to the common source line CSL, is interrupted, and the potential of the common source line CSL decreases.

Referring to FIG. 5, at step 501, the semiconductor memory device sets the level of an erase voltage, and a period of time for which the erase voltage is applied (duration of the erase voltage application). The level of the erase voltage and the duration of the erase voltage application (application time) may be determined according to preset values.

At step 502, the semiconductor memory device may perform an erase operation on memory cells included in the selected memory block by applying the erase voltage to a selected memory block. For example, an erase enable voltage may be applied to all of the word lines coupled to the selected memory block, and an erase voltage may be applied to well regions of the transistors in the selected memory block or the common source line CSL, depending on the structure of the memory block.

At step 503, the semiconductor memory device applies the erase voltage for a predetermined period of time, and then performs an erase verify operation. For example, the erase verify operation is performed to determine whether the threshold voltages of all of the memory cells included in the memory block have reached a target level (e.g., a negative voltage level). If all of the memory cells in the selected memory block have passed the erase verification, the erase operation of the selected memory block is completed. However, if it is determined that threshold voltages of some memory cells have not reached the target level yet, the process enters step 504.

At step 504, the semiconductor memory device increases the erase voltage by a step voltage. In this case, the erase voltage may be increased by a preset step voltage. The semiconductor memory device enters step 502 and applies an increased erase voltage to the selected memory block to further reduce the threshold voltages of the memory cells included in the selected memory block.

Figure 6:
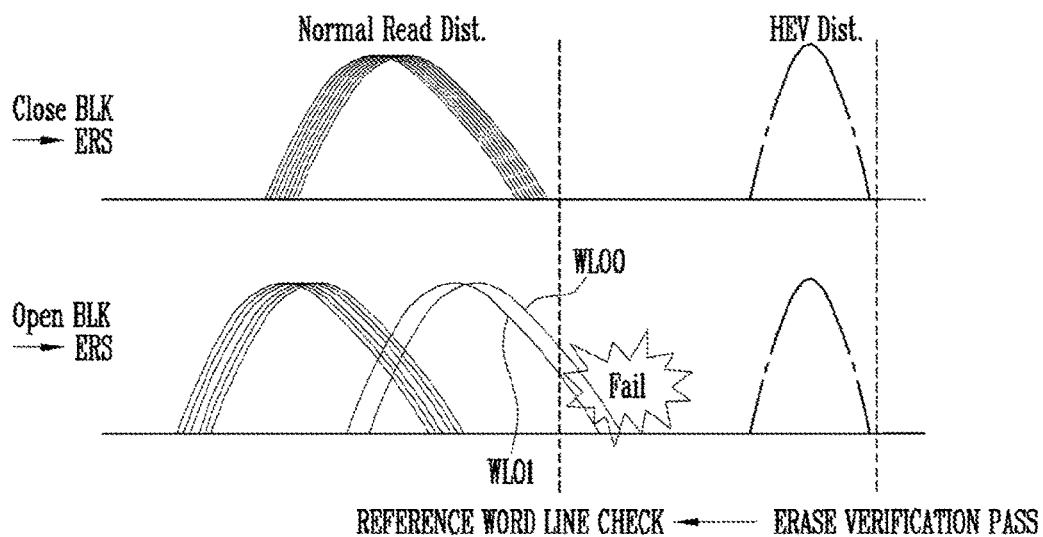
FIG. 6 is a diagram illustrating an example of the erase operation of the semiconductor memory device of FIG. 5.

FIG. 6 is a diagram illustrating an example of the erase operation of the semiconductor memory device of FIG. 5.

In FIG. 6, dashed dotted lines indicate a threshold voltage distribution in the situation where all of the word lines coupled to the selected memory block have passed the erase verification, and solid lines indicate an actual threshold voltage distribution.

During the erase verify operation of the semiconductor memory device, whether the erase operation has been completed is determined by performing the erase verification operation while keeping all of the word lines of the selected memory block at a low voltage (e.g., ground voltage). Here, in the case of a program-completed block Close BLK (all pages included in the memory block are programmed), it is expected that, after the application of the erase voltage, the width of threshold voltage distribution is uniform and narrow.

On the other hand, in the case of an open block Open BLK (only part of the memory block is programmed), even if all of the word lines of the selected memory block have passed the erase verification when the erase verify operation is performed while keeping all the word lines at the low voltage (e.g. ground voltage), if the threshold voltages of memory cells are read on a word-line by word-line basis, the threshold voltage of memory cells coupled to a first word line WL00 or a second word line WL01 may fail to reach the target threshold voltage in an erased status. In other words, even if all of the word lines of the selected memory block have passed the erase verification, there may exist non-erased cells in the memory block.

Therefore, if the same erase verify voltage is used for both the open block and the program-completed block, an erase speed may deteriorate, depending on a P/E (program/erase) cycle, the erase speed may deteriorate by lack of erase (ERS) time due to erase (ERS) suspend, the erase speed may deteriorate due to a reduction in temperature of the semiconductor memory device, or the erase speed may deteriorate, depending on a plurality of planes. As such, in the case where the erase speed decreases, erase-verified memory block may turn out to have one or more non-erased memory cells. In an embodiment, however, after the erase verify operation, an additional erase verify operation is performed with respect to one or more word lines.

Figure 7:
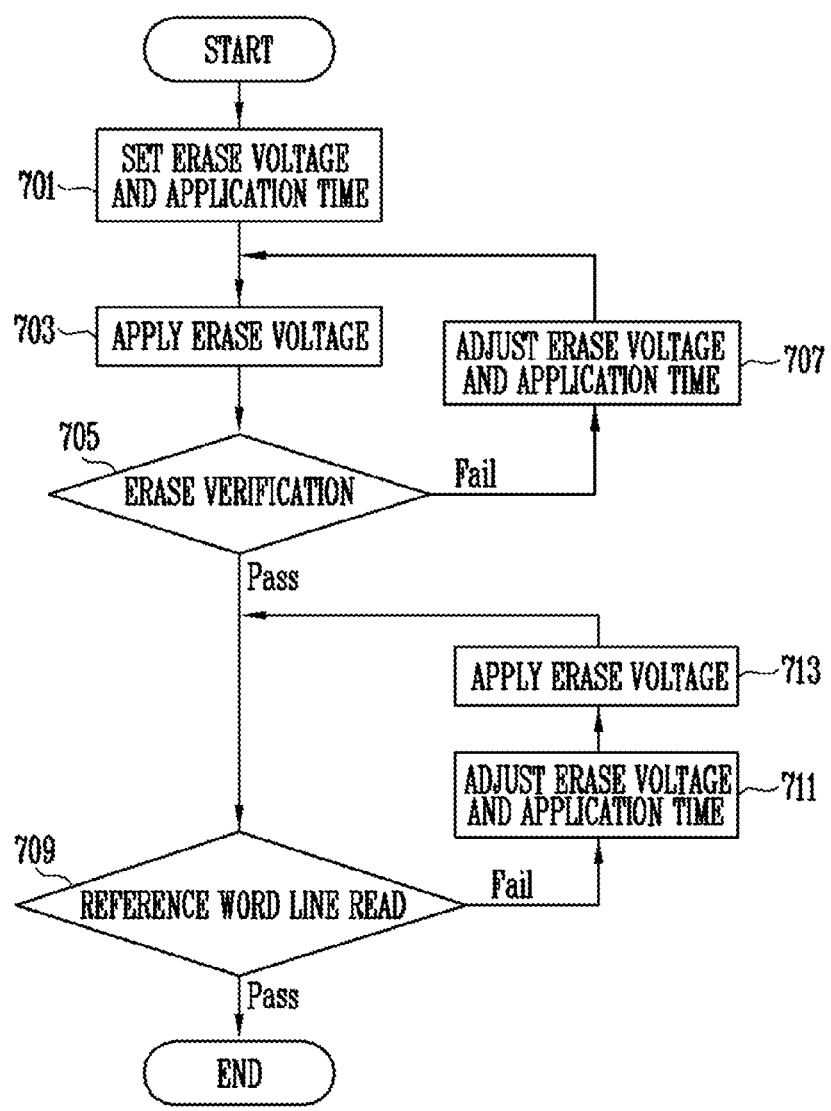
FIG. 7 is a flowchart illustrating a method of operating a semiconductor memory device in accordance with an embodiment of the present disclosure.

FIG. 7 is a flowchart illustrating a method of operating the semiconductor memory device according to an embodiment of the present disclosure.

Referring to FIG. 7, at step 701, the semiconductor memory device sets the level of an erase voltage, and a period of time for which the erase voltage is applied (i.e., "duration of the erase voltage application" or "application time"). The level of the erase voltage and the duration of the erase voltage application may be determined according to the preset values. In an embodiment, at step 701, the semiconductor memory device may set a start voltage of the erase operation, the level of a step voltage, and the duration of the erase voltage application.

At step 703, the semiconductor memory device may perform an erase operation on memory cells included in the selected memory block by applying the erase voltage to a selected memory block. For example, an erase enable voltage may be applied to all of the word lines coupled to the selected memory block, and an erase voltage may be applied to the well regions of the transistors in the selected memory block or the common source line CSL, depending on the structure of the memory block.

At step 705, the semiconductor memory device applies the erase voltage for a predetermined period of time, and then performs an erase verify operation. For example, the erase verify operation is performed to determine whether the threshold voltages of all of the memory cells included in the memory block have reached a target level (e.g., a negative voltage level). If the result of the erase verify operation indicates "fail," the process enters step 707.

At step 707, the semiconductor memory device increases the erase voltage by a step voltage. In an embodiment, the semiconductor memory device may adjust the erase voltage and the duration of the erase voltage application (application time) depending on the result of the verification of step 705. In various embodiments, at step 707, the semiconductor memory device may maintain the step voltage and the duration of the erase voltage application (application time) that have been set at step 701, without changing them.

At step 705, if the result of the erase verify operation indicates "pass," the semiconductor memory device may perform step 709.

At step 709, the semiconductor memory device may read a reference word line. In an embodiment, the reference word line may be a word line that is predetermined for the purpose of the additional erase verify operation. The reference word line may be a word line corresponding to a page that is first programmed in the selected memory block. That is, the reference word line may be a word line that is first selected during a program operation for the selected memory block. In an embodiment, the reference word line may be a first word line WL00. In an embodiment, the reference word line may include more than one word line. For example, two or more word lines may be selected as the reference word lines according to a sequence in which the word lines are selected during the program operation. In an embodiment, the reference word line may be the first word line WL00 and the second word line WL01.

At step 709, an additional erase verify operation may be performed for the reference word line. The semiconductor memory device may verify the erase states of the memory cells coupled to the reference word line by applying an erase verify voltage to the selected word line and sensing voltages or currents output through the bit lines.

In an embodiment, although not illustrated, the semiconductor memory device may determine whether the erase operation is terminated, depending on the result of the erase verification of step 709 for the memory cells coupled to the reference word line. For example, if the result of the erase verification of step 709 for the memory cells coupled to the reference word line indicates "fail," the semiconductor memory device may perform an erase operation of step 703 for the entirety of the memory block without performing operations of steps 711 and 713, and then perform an erase verify operation of step 705.

If, at step 709, the result of the erase verification indicates "pass," the semiconductor memory device terminates the erase verify operation. If, at step 709, the result of the erase verification indicates "fail," the process enters step 711.

At step 711, the semiconductor memory device may set the level of the erase voltage and the duration of the erase voltage application (application time). In an embodiment, the semiconductor memory device may set at least one of the level of a step voltage, which is an increment of the erase voltage, and the application time of the erase voltage. For example, if the result of the erase verification for the memory cells coupled to the reference word line indicates "fail," the semiconductor memory device may set the level of the step voltage to a value less than the level of the step voltage set at step 701 or 707, or may reduce the duration of the erase voltage application (application time) such that the duration of the erase voltage application (application time) here is shorter than the duration of the erase voltage application (application time) set at step 701 or 707. Alternatively, the semiconductor memory device may set the level of the step voltage to a value less than the level of the preset step voltage, and set the duration of the erase voltage application (application time) such that the application time is shorter than the preset duration of the erase voltage application (application time).

Figure 8:
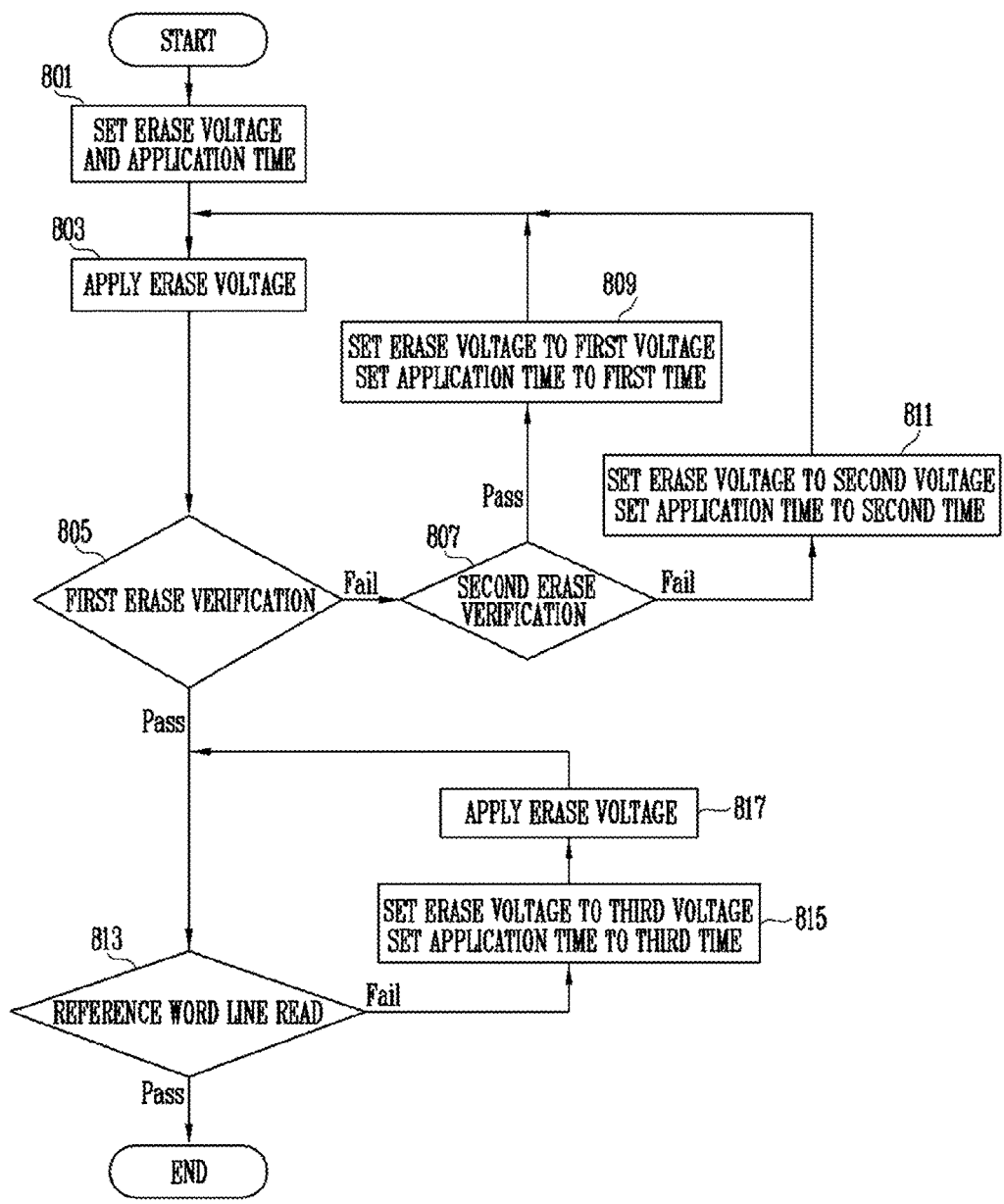
FIG. 8 is a flowchart illustrating a method of operating a semiconductor memory device in accordance with an embodiment of the present disclosure.

FIG. 8 is a flowchart illustrating a method of operating the semiconductor memory device in accordance with an embodiment of the present disclosure.

Referring to FIG. 8, at step 801, the semiconductor memory device sets the level of the erase voltage, and the duration of the erase voltage application (application time). The level of the erase voltage and the duration of the erase voltage application (application time) may be determined according to the preset values. In an embodiment, at step 801, the semiconductor memory device may set a start voltage of the erase operation, the level of a step voltage, and the duration of the erase voltage application (application time).

At step 803, the semiconductor memory device may perform an erase operation on memory cells included in the selected memory block by applying the erase voltage to a selected memory block. For example, an erase enable voltage may be applied to all of the word lines coupled to the selected memory block, and an erase voltage may be applied to the well regions of the transistors in the selected memory block or the common source line CSL, depending on the structure of the memory block.

At step 805, the semiconductor memory device applies the erase voltage for a predetermined period of time, and then performs a first erase verify operation. For example, the first erase verify operation is performed to determine whether the threshold voltages of all of the memory cells included in the memory block have reached a target level (e.g., a negative voltage level). In detail, the semiconductor memory device may verify the threshold voltages of the memory cells using a first verify voltage. The first verify voltage may be a verify voltage for verifying erase states of the memory cells. If the result of the first erase verify operation indicates "fail," the process enters step 807.

At step 807, the semiconductor memory device may change the verify voltage and perform the erase verify operation for the selected memory block. For example, for the selected memory block, a second verify operation for the selected memory block may be performed using a second verify voltage higher than the first verify voltage.

The semiconductor memory device may set the erase voltage and the duration of the erase voltage application depending on the result of the second erase verify operation. In detail, if the result of the second verify operation indicates "fail," the semiconductor memory device enters step 811, and if the result indicates "pass," it enters step 809.

At step 809, the semiconductor memory device may set the erase voltage and the duration of the erase voltage application (application time) such that the erase loop is repeatedly performed according to the preset step voltage and the preset duration of the erase voltage application (application time). For example, the semiconductor memory device may set the erase voltage to a first voltage and set the duration of the erase voltage application (application time) to a first time. In an embodiment, the first voltage and the first time may be the same as the level of the erase voltage and the duration of the erase voltage application (application time) that have been set at step 801. In an embodiment, the first voltage may be the level of a step voltage.

At step 811, the semiconductor memory device may set the erase voltage and the duration of the erase voltage application such that the erase loop is repeatedly performed according to the preset step voltage and the preset duration of the erase voltage application (application time). For example, the semiconductor memory device may set the erase voltage to a second voltage and set the duration of the erase voltage application (application time) to a second time. In an embodiment, the second voltage and the second time may be, respectively, higher and longer than the first voltage and the first time that have been set at step 809.

At step 805, if the semiconductor memory device has passed the first verification, it may read a reference word line, at step 813. In an embodiment, the reference word line may be a word line that is predetermined for the purpose of the additional erase verify operation. The reference word line may be a word line corresponding to a page that is first programmed in the selected memory block. That is, the reference word line may be a word line that is first selected during a program operation for the selected memory block. In an embodiment, the reference word line may be a first word line WL00. In an embodiment, the reference word line may include more than one word line. For example, two or more word lines may be selected as the reference word lines according to a sequence in which the word lines are selected during the program operation. In an embodiment, the reference word line may be the first word line WL00 and the second word line WL01.

At step 813, an additional erase verify operation may be performed for the reference word line. The semiconductor memory device may verify the erase states of the memory cells coupled to the reference word line by applying an erase verify voltage to the selected word line and sensing voltages or currents output through the bit lines.

In an embodiment, although not illustrated, the semiconductor memory device may determine whether the erase operation is terminated, depending on the result of the erase verification of step 813 for the memory cells coupled to the reference word line. For example, if the result of the erase verify operation of step 813 for the memory cells coupled to the reference word line indicates "fail," the semiconductor memory device may perform an erase operation of step 803 for the entirety of the memory block without performing operations of steps 815 and 817, and then reperform the first verify operation (at step 805) and the second verify operation (at step 807). If the result of the erase verify operation at step 813 indicates a pass, the semiconductor memory device terminates the verify operation. If, at step 813, the result of the erase verify operation indicates "fail," the process enters step 815.

At step 815, the semiconductor memory device may set the level of the erase voltage and the duration of the erase voltage application. In an embodiment, the semiconductor memory device may set at least one of the level of a step voltage, which is an increment of the erase voltage, and the application time of the erase voltage. For example, if the result of the erase verify operation for the memory cells coupled to the reference word line indicates "fail," the semiconductor memory device may set the level of the step voltage to a third voltage, and set the duration of the erase voltage application (application time) to a third time. In an embodiment, the third voltage may be equal to or less than the level of the second voltage. The duration of the third time may be equal to or shorter than that of the second time.

At step 817, the semiconductor memory device may apply the set erase voltage to the selected memory block for the set duration of the erase voltage application (set application time).

Figure 9:
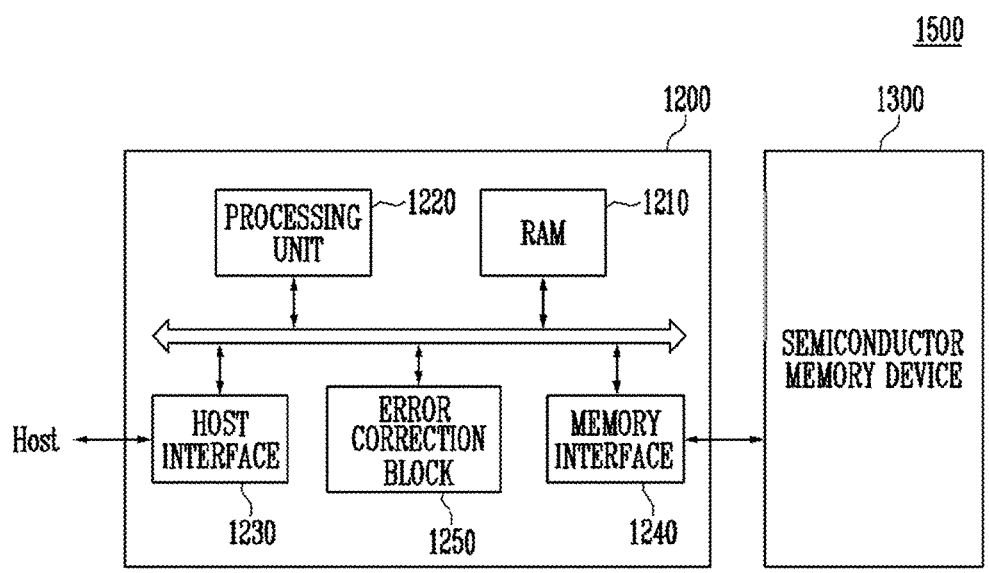
FIG. 9 is a diagram illustrating an example of a memory system including the semiconductor memory device of FIG. 2.

FIG. 9 is a diagram illustrating an example of a memory system including the semiconductor memory device of FIG. 2.

Referring to FIG. 9, the memory system 1500 includes a semiconductor memory device 1300 and a controller 1200.

The semiconductor memory device 1300 may have the same configuration and perform the same operation as the semiconductor memory device 1000 described with reference to FIG. 2. Hereinafter, any repetitive detailed description will be omitted or simplified.

The controller 1200 is coupled to a host Host and the semiconductor memory device 1300. The controller 1200 may access the semiconductor memory device 1300 in response to a request from the host Host. For example, the controller 1200 may control read, write, erase, and background operations of the semiconductor memory device 1300. The controller 1200 may provide an interface between the host Host and the semiconductor memory device 1300. The controller 1200 may run firmware for controlling the semiconductor memory device 1300.

The controller 1200 includes a random access memory (RAM) 1210, a processing unit 1220, a host interface 1230, a memory interface 1240, and an error correction block 1250.

The RAM 1210 is used as any one of a work memory of the processing unit 1220, a cache memory between the semiconductor memory device 1300 and the host Host, and a buffer memory between the semiconductor memory device 1300 and the host Host.

The processing unit 1220 controls the overall operation of the controller 1200.

The processing unit 1220 may randomize data received from the host Host. For example, the processing unit 1220 may use a randomizing seed to randomize data received from the host Host. The randomized data is provided, as data to be stored, to the semiconductor memory device 1300 and is then written in the memory cell array.

The processing unit 1220 may derandomize data received from the semiconductor memory device 1300 during a read operation. For example, the processing unit 1220 may use a derandomizing seed to derandomize data received from the semiconductor memory device 1300. Derandomized data may be output to the host Host.

In an embodiment, the processing unit 1220 may drive software or firmware to perform the randomizing or derandomizing operation.

The host interface 1230 includes a protocol for performing data exchange between the host Host and the controller 1200. In an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface 1240 includes a NAND interface or NOR interface.

The error correction block 1250 may use an error correcting code (ECC) to detect and correct an error in data received from the semiconductor memory device 1300.

The controller 1200 and the semiconductor memory device 1300 may be integrated into a single semiconductor device. In an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCM-CIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the memory system is used as the SSD, an operation speed of the host Host coupled to the memory system may be phenomenally improved.

In an embodiment, the memory system may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1300 or the memory system may be embedded in various types of packages. For example, the semiconductor memory device 1300 or the memory system may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 10:
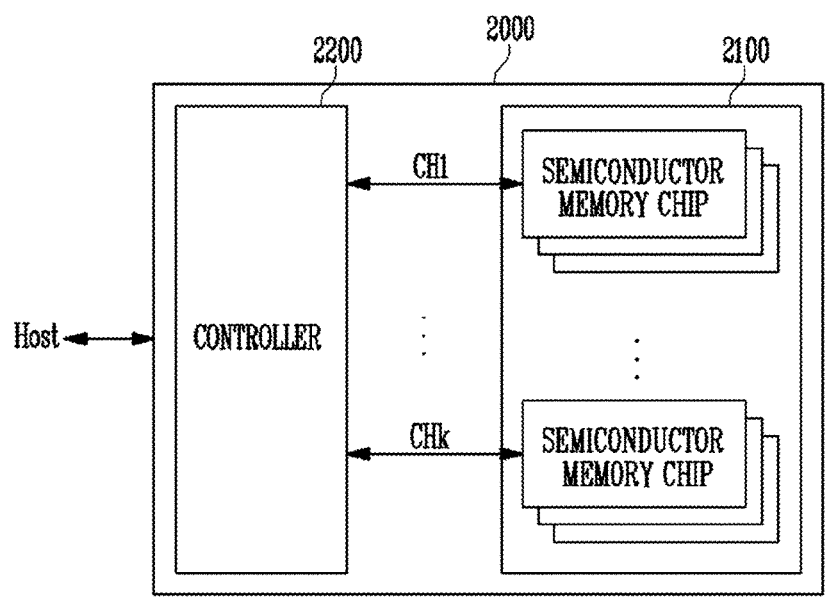
FIG. 10 is a diagram illustrating an example of the memory system of FIG. 9.

FIG. 10 is a diagram illustrating an example of the memory system of FIG. 9.

Referring to FIG. 10, the memory system 2000 includes a semiconductor memory device 2100 and a controller 2200. The semiconductor memory device 2100 includes a plurality of semiconductor memory chips. The semiconductor memory chips are divided into a plurality of groups.

In FIG. 10, it is illustrated that each of the plurality of groups communicates with the controller 2200 through first to k-th channels CH1 to CHk. Each semiconductor memory chip may have the same configuration and operate in the same way as the semiconductor memory device 1000 described with reference to FIG. 2.

Each group communicates with the controller 2200 through one common channel. The controller 2200 has the same configuration as that of the controller 1200 described with reference to FIG. 9 and may control the plurality of memory chips of the semiconductor memory device 2100 through the plurality of channels CH1 to CHk.

In FIG. 10, a plurality of semiconductor memory chips is illustrated as being coupled to a single channel. However, it will be understood that the memory system 2000 may operate in a way that a single semiconductor memory chip is coupled to a single channel.

Figure 11:
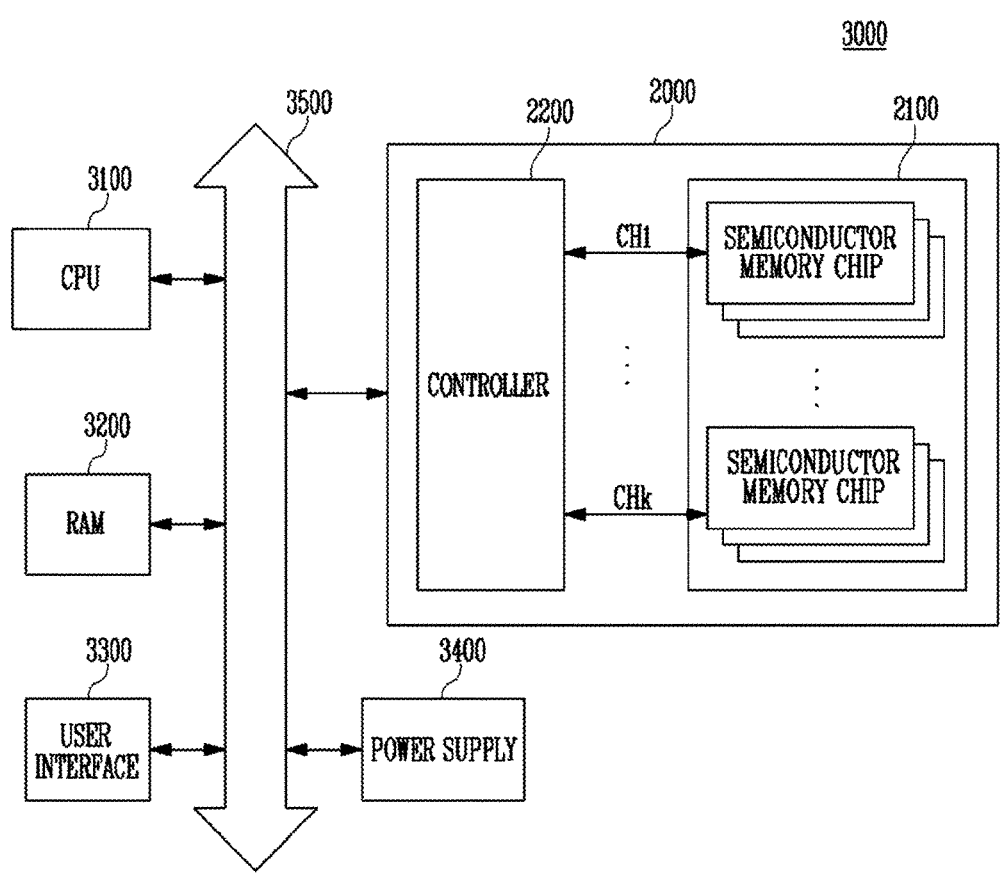
FIG. 11 is a diagram illustrating an example of a computing system including the memory system illustrated with reference to FIG. 10.

FIG. 11 is a diagram illustrating an example of a computing system including the memory system described with reference to FIG. 10.

Referring to FIG. 11, the computing system 3000 may include a central processing unit (CPU) 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 11, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 11, the memory system 2000 described with reference to FIG. 10 is illustrated as being provided. However, the memory system 2000 may be replaced with the memory system 1500 described with reference to FIG. 9. In an embodiment, the computing system 3000 may include all of the memory systems 1500 and 2000 described with reference to FIGS. 9 and 10.

Various embodiments of the present disclosure provide a semiconductor memory device having enhanced reliability, and a method of operating the semiconductor memory device.

Although various embodiments of the present invention have been disclosed, those skilled in the art will appreciate that various modifications, additions and substitutions are possible, without departing from the scope and spirit of the invention.

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings just aims to help those with ordinary knowledge in this art more clearly understand the present disclosure rather than aiming to limit the bounds of the present invention. In other words, one of ordinary skill in the art to which the present disclosure belongs will be able to easily understand that various modifications are possible based on the technical scope of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
a plurality of memory cells included in a plurality of memory blocks, respectively;
a peripheral circuit configured to perform an erase operation on a selected memory block among the plurality of memory blocks; and
a control circuit configured to control the peripheral circuit to perform an additional erase verification operation, when threshold voltages of all memory cells included in the selected memory block have reached an erase state, on memory cells coupled to a reference word line among a plurality of word lines coupled to the selected memory block, and to perform an additional erase operation according to a result of the additional erase verification operation for the memory cells coupled to the reference word line included in the selected memory block,
wherein the control circuit is configured to designate a word line to be selected first to be the reference word line according to a predetermine program sequence, and
wherein the additional erase verification operation is performed on less than all of the plurality of word lines.

2. The semiconductor memory device according to claim 1, wherein, during the erase operation, the control circuit repeatedly performs, until the threshold voltages of all memory cells included in the selected memory block have reached the erase state, an erase voltage application operation of applying an erase voltage to the selected memory block, and an erase verification operation for the selected memory block.

3. The semiconductor memory device according to claim 2, wherein, each time the erase voltage application operation and the erase verification operation are repeatedly performed, the control circuit increases the erase voltage by a first step voltage.

4. The semiconductor memory device according to claim 3, wherein the control circuit increases the erase voltage by a second step voltage having a level less than a level of the first step voltage when the memory cells coupled to the reference word line have failed the additional erase verification operation.

5. The semiconductor memory device according to claim 2, wherein, each time the erase voltage application operation and the erase verification operation are repeatedly performed, the control circuit applies the erase voltage to the selected memory block for a duration of a first time.

6. The semiconductor memory device according to claim 5, wherein the control circuit applies the erase voltage to the selected memory block for a duration of a second time shorter than the first time when the memory cells coupled to the reference word line have failed the additional erase verification operation.

7. The semiconductor memory device according to claim 1, wherein, when the memory cells coupled to the reference word line have passed the additional erase verification operation, the control circuit terminates the erase operation.

8. A method of operating a semiconductor memory device, comprising:
performing an erase operation on a plurality of memory cells included in a selected memory block among a plurality of memory blocks using a first step voltage;
performing a first verify operation using a first verify voltage to check whether an erase operation of the selected memory block has been completed;

performing a second verify operation according to a result of the first verify operation to check whether threshold voltages of memory cells coupled to a reference word line have reached the first verify voltage; and performing an additional erase operation on the plurality of memory cells included in the selected memory block using an erase condition determine by a result of the second verify operation, wherein the reference word line is a word line of a plurality of word lines which is designated to be selected first according to a predetermine program sequence of the selected memory block, and wherein the second verify operation is performed on less than all of the plurality of word lines.

9. The method according to claim 8, wherein the performing the second verify operation comprises:

verifying the threshold voltages of the memory cells coupled to the reference word line among a plurality of word lines coupled to the selected memory block to check whether the threshold voltages have reached the first verify voltage when the selected memory block has passed the first verify operation.

10. The method according to claim 9, wherein the performing the additional erase operation comprises:

performing the erase operation on the plurality of memory cells included in the selected memory block among the plurality of memory blocks using a second step voltage less than the first step voltage when the second verify operation has failed.

11. The method according to claim 8, wherein the performing the second verify operation comprises:

verifying threshold voltages of the plurality of memory cells included in the selected memory block to check whether the threshold voltages have reached a second verify voltage having a level higher than a level of the first verify voltage.

12. The method according to claim 11, wherein the performing the additional erase operation comprises:

performing the erase operation on the plurality of memory cells included in the selected memory block among the plurality of memory blocks using a third step voltage less than the first step voltage when the second verify operation has passed.

13. The method according to claim 11, wherein the performing the additional erase operation comprises:

performing the erase operation on the plurality of memory cells included in the selected memory block among the plurality of memory blocks using a fourth step voltage higher than the first step voltage when the second verify operation has failed.

14. A method of operating a semiconductor memory device, comprising:

performing an erase operation on a plurality of memory cells included in a selected memory block among a plurality of memory blocks using a first duration time of an erase voltage;

performing a first verify operation using a first verify voltage to check whether an erase operation of the selected memory block has been completed;

performing a second verify operation according to a result of the first verify operation to check whether threshold voltages of memory cells coupled to a reference word line have reached the first verify voltage; and performing an additional erase operation on the plurality of memory cells included in the selected memory block using an erase condition determine by a result of the second verify operation, wherein the reference word line is a word line of a plurality of word lines which is designated to be selected first according to a predetermine program sequence of the selected memory block, and wherein the second verify operation is performed on less than all of the plurality of word lines.

15. The method according to claim 14, wherein the performing the second verify operation comprises:

verifying the threshold voltages of the memory cells coupled to the reference word line among a plurality of word lines coupled to the selected memory block to check whether the threshold voltages have reached the first verify voltage when the selected memory block has passed the first verify operation.

16. The method according to claim 15, wherein the performing the additional erase operation comprises:

performing the erase operation on the plurality of memory cells included in the selected memory block among the plurality of memory blocks using a second duration time of the erase voltage shorter than the first duration time of the erase voltage when the second verify operation has failed.

17. The method according to claim 14, wherein the performing the second verify operation comprises:

verifying threshold voltages of the plurality of memory cells included in the selected memory block to check whether the threshold voltages have reached a second verify voltage having a level higher than a level of the first verify voltage.

18. The method according to claim 17, wherein the performing the additional erase operation comprises:

performing the erase operation on the plurality of memory cells included in the selected memory block among the plurality of memory blocks using a third duration time of the erase voltage shorter than the first duration time of the erase voltage when the second verify operation has passed.

19. The method according to claim 17, wherein the performing the additional erase operation comprises:

performing the erase operation on the plurality of memory cells included in the selected memory block among the plurality of memory blocks using a fourth duration time of the erase voltage longer than the first duration time of the erase voltage when the second verify operation has failed.

* * * * *